(12) United States Patent
Liao et al.

(10) Patent No.: US 11,705,076 B2
(45) Date of Patent: Jul. 18, 2023

(54) CHOLESTERIC LIQUID CRYSTAL COMPOSITE DISPLAY DEVICE

(71) Applicant: IRIS OPTRONICS CO., LTD., Tainan (TW)

(72) Inventors: Chi-Chang Liao, Tainan (TW); Cheng-Hung Yao, Tainan (TW); Chieh-Chao Ho, Tainan (TW)

(73) Assignee: IRIS OPTRONICS CO., LTD., Tainan (TW)

( * ) Notice: Subject to any disclaimer, the term of this patent is extended or adjusted under 35 U.S.C. 154(b) by 1 day.

(21) Appl. No.: 17/737,381

(22) Filed: May 5, 2022

(65) Prior Publication Data
US 2022/0358887 A1    Nov. 10, 2022

(30) Foreign Application Priority Data
May 7, 2021   (TW) .................................. 110116630

(51) Int. Cl.
*G09G 3/34*  (2006.01)
*G02F 1/13357*  (2006.01)
(Continued)

(52) U.S. Cl.
CPC ..... *G09G 3/3413* (2013.01); *G02F 1/133603* (2013.01); *G02F 1/133621* (2013.01);
(Continued)

(58) Field of Classification Search
CPC ........... G09G 2360/144; G09G 3/3611; G09G 3/344; G02F 1/13318
See application file for complete search history.

(56) References Cited

U.S. PATENT DOCUMENTS

2005/0206633 A1* 9/2005 Mukai ....................... G09G 3/34
345/204
2007/0211013 A1* 9/2007 Uehara ................ G09G 3/3413
345/102
(Continued)

FOREIGN PATENT DOCUMENTS

CN     110632794 A   12/2019
JP     2001-301233 A  10/2001
(Continued)

*Primary Examiner* — Shaheda A Abdin
(74) *Attorney, Agent, or Firm* — WPAT, P.C

(57) ABSTRACT

A cholesteric liquid crystal (LC) composite display device includes a light absorbing substrate, a first and second transparent substrates, a light supplement module arranged between the light absorbing substrate and the first transparent substrate, a control module, a first and second electrode layers respectively formed on the first and second transparent substrates, a first cholesteric LC layer sandwiched between the first and second electrode layers, and a first light absorbing layer disposed on the second transparent substrate. The projection of the first light absorbing layer on the horizontal plane and the projection of the light supplement module on the horizontal plane are arranged in a misaligned manner. The control module is provided for controlling the light supplement module according to the brightness signal. Thereby, when the external brightness is low, the light supplement module enhances the displaying brightness of the cholesteric LC composite display device to meet the usage requirements.

13 Claims, 6 Drawing Sheets

(51) Int. Cl.
*G02F 1/1343* (2006.01)
*G09G 3/36* (2006.01)
*H10K 59/50* (2023.01)

(52) U.S. Cl.
CPC ......... *G02F 1/134309* (2013.01); *G09G 3/36* (2013.01); *H10K 59/50* (2023.02); *G02F 2201/08* (2013.01); *G02F 2201/52* (2013.01); *G09G 2320/0626* (2013.01); *G09G 2360/144* (2013.01)

(56) References Cited

U.S. PATENT DOCUMENTS

| | | | | |
|---|---|---|---|---|
| 2010/0053117 | A1* | 3/2010 | Ishii | G09G 3/008 345/175 |
| 2015/0069128 | A1* | 3/2015 | Hoshino | B42D 25/328 235/457 |
| 2016/0343308 | A1* | 11/2016 | Hasegawa | G02F 1/133504 |

FOREIGN PATENT DOCUMENTS

| | | |
|---|---|---|
| TW | 201812407 A | 4/2018 |
| TW | M594163 | 4/2020 |

* cited by examiner

CHOLESTERIC LIQUID CRYSTAL COMPOSITE DISPLAY DEVICE

FIELD OF THE DISCLOSURE

The invention relates to the technical field of displays, in particular to a cholesteric liquid crystal (LC) composite display device.

BACKGROUND

The cholesteric liquid crystal display is a kind of liquid crystal display, in which the cholesteric liquid crystal has bistable characteristics: that is to say, there are two stable states with no external force applied, which is the difference from the commonly used TFT liquid crystal display today.

The molecular arrangement of cholesteric liquid crystal has two stable states, the focal conic state (Focal Conic State) and the planar state (Planar State), so it has bistable characteristics, that is, the cholesteric liquid crystal does not need extra energy from the outside world. The original liquid crystal molecular arrangement state is maintained. When a voltage is applied, the alignment state of the cholesteric liquid crystal molecules can be controlled to switch between two stable states: the focal conic alignment state and the planar alignment state. As mentioned above, when the cholesteric liquid crystal is in a planar arrangement, it will reflect light of a specific wavelength; on the contrary, when the cholesteric liquid crystal is in a focal conic arrangement, the light will penetrate. Therefore, the voltage applied to the cholesteric liquid crystal can control whether the cholesteric liquid crystal transmits light or reflects light of a specific wavelength.

Most of the existing cholesteric liquid crystal displays must use an external ambient light source for the cholesteric liquid crystal to reflect light to display pictures and colors. When in a low-brightness environment, the display brightness and color fullness often not meet the standards and that may cause eye fatigue to users.

Therefore, the main purpose of the present invention is to provide a cholesteric liquid crystal composite display device to solve the above problems.

SUMMARY

The object of the present invention is to provide a cholesteric liquid crystal composite display device, which can effectively avoid the interference of the external environment, especially the low-brightness environment to its display performance, to provide users a good experience.

In order to achieve at least one of the advantages or other advantages, an embodiment of the present invention provides a cholesteric liquid crystal composite display device, which includes a light absorbing substrate, a first transparent substrate, a second transparent substrate, a light supplement module, a control module, a first electrode layer, a second electrode layer, a first cholesteric liquid crystal layer, and a first light absorbing layer.

The light supplement module is disposed between the light absorbing substrate and the first transparent substrate, and the projection of the first light absorbing layer on the horizontal plane and the projection of the light supplement module on the horizontal plane are arranged in a misaligned manner. The light supplement module is used for emitting supplementary light to enhance the display brightness of the cholesteric liquid crystal composite display device.

The control module is electrically connected to the light supplement module for turning on or off the light supplement module.

The first electrode layer is formed on the first transparent substrate. The second electrode layer is formed on the second transparent substrate, and is disposed opposite to the first electrode layer.

The first cholesteric liquid crystal layer is sandwiched between the first electrode layer and the second electrode layer for generating a first color light, and the first color light has a first wavelength range. The first light absorbing layer is disposed on one side of the second transparent substrate and is used for absorbing light except the first wavelength range.

In some embodiments, the cholesteric liquid crystal composite display device may further include a brightness sensing module electrically connected to the control module for sensing the brightness of the external environment to generate the brightness signal. To further illustrate, the brightness sensing module can be disposed inside the cholesteric liquid crystal composite display device, and can also be externally connected to the cholesteric liquid crystal composite display device.

In some embodiments, the cholesteric liquid crystal composite display device may further include a third transparent substrate, a third electrode layer, a fourth electrode layer, a second cholesteric liquid crystal layer, and a second light absorbing layer. The third electrode layer is formed on the second transparent substrate, the fourth electrode layer is formed on the third transparent substrate, the fourth electrode layer and the third electrode layer are arranged facing each other, the second cholesteric liquid crystal layer is sandwiched between the third electrode layer and the fourth electrode layer and used to generate a second color light. The second color light has a second wavelength range. The second wavelength range is different from the first wavelength range. The second light absorbing layer is disposed on one side of the third transparent substrate, corresponds to the top of the first light absorbing layer, and is used for absorbing light except the first wavelength range and the second wavelength range.

In some embodiments, the cholesteric liquid crystal composite display device may further include a fourth transparent substrate, a fifth electrode layer, a sixth electrode layer and a third cholesteric liquid crystal layer. The fifth electrode layer is formed on the third transparent substrate, the sixth electrode layer is formed on the fourth transparent substrate, the sixth electrode layer and the fifth electrode layer are arranged facing each other. The third cholesteric liquid crystal layer is sandwiched between the fifth electrode layer and the sixth electrode layer and used to generate a third color light.

In some embodiments, the colors of the first color light, the second color light and the third color light are respectively selected from one of the groups consisting of red, blue and green, and the colors of the first color light, the second color light and the third color light are different.

In some embodiments, the light supplement module includes an OLED panel.

In some embodiments, the light supplement module includes a light emitting chip array, the light emitting chip array includes a plurality of first light emitting chips, a second light emitting chips and a third light emitting chips. The first light emitting chip, the second light emitting chip and the third light emitting chip are arranged side by side on the light absorbing substrate, and the first light emitting chip, the second light emitting chip and the third light emitting chip may be micro LED chips or mini LED chips.

In some embodiments, the light emitting colors of the first light emitting chip, the second light emitting chip, and the third light emitting chip are respectively selected from one of the groups consisting of red, blue, and green, and the light emitting colors of the first light emitting chip, the second light emitting chip and the third light emitting chip are different.

Therefore, using a cholesteric liquid crystal composite display device provided by the present invention, when the brightness of the external environment is low, the control module can automatically or manually control the light supplement module to generate the supplementary light to enhance the display brightness of the cholesteric liquid crystal composite display device, and enhance the color fullness of the cholesteric liquid crystal composite display device through the light absorbing layer.

The foregoing description is merely an overview of the technical solution of the present invention. In order to enable a clearer understanding of the technical means of the present invention, and thus it can be implemented in accordance with the teachings of the present invention, and to enable the above features and advantages of the present invention to be more clearly understood, the embodiments are described in detail with reference to the accompanying drawings.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
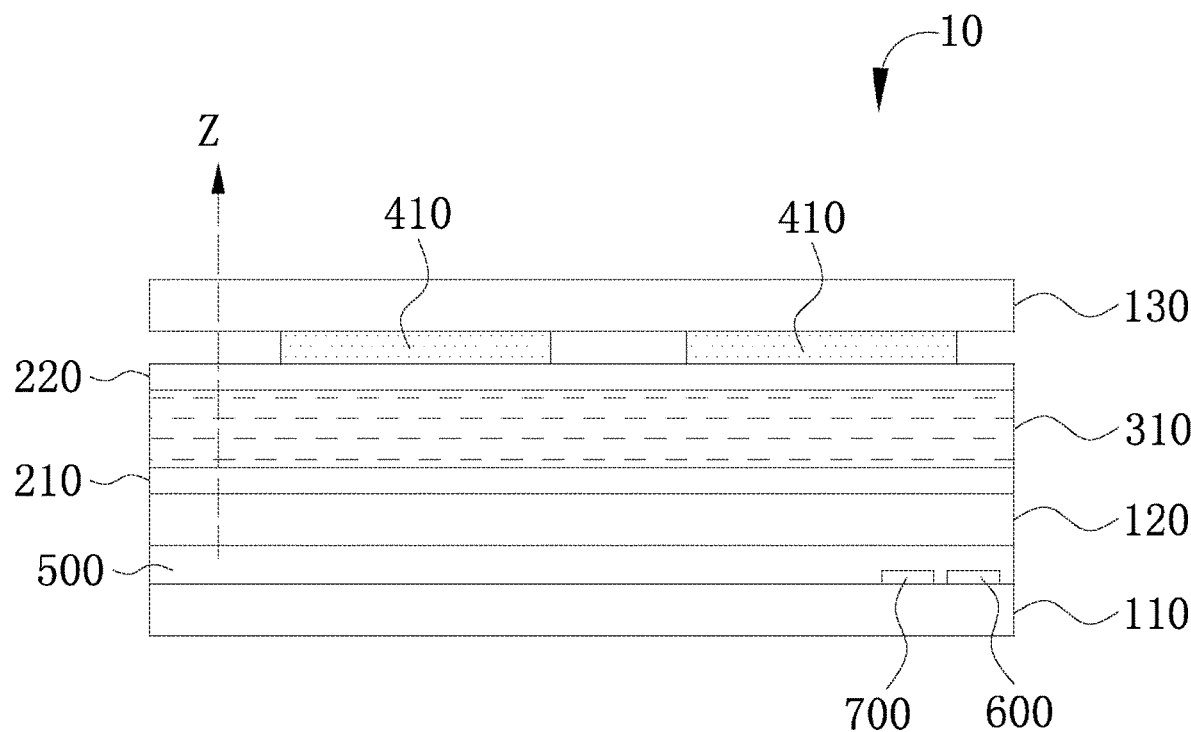
FIG. 1 and FIG. 2 are schematic cross-sectional views of the first embodiment of the cholesteric liquid crystal composite display device of the present invention.

The specific structural and functional details disclosed herein are only representative and are intended for describing exemplary embodiments of the disclosure. However, the disclosure can be embodied in many forms of substitution and should not be interpreted as merely limited to the embodiments described herein.

In the description of the present invention, the terms for indicating orientations or positional relationships such as "center", "longitudinal direction", "above", "below", "left", "right", "vertical", "horizontal", "top", "bottom", "inside" and "outward" for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. In addition, the terms as "first" and "second" are used for describing purpose and cannot be interpreted as the instruction or hint about the importance nor be implied the quantity of characteristic elements. Thus, the feature limited with "first" or "second" may include one or more characteristic element. In description of the present invention, the implication of "multiple" is two or more unless otherwise indicated. Further, the terms "comprises," "comprising," or any other variation thereof, are intended to cover a non-exclusive inclusion.

In this invention, unless otherwise clearly defined and limited, the terms such as "installation", "being connected" and "connection" should be interpreted broadly, such as, can be fixedly connected with, also can be removably connected, or connected in one piece; and can be mechanically connected, also can be electrically connected; can be directly connected, also can be indirectly connected; can be connected by intermedia; can be the connection of two element internally. For the ordinary skilled in the art, the actual meaning of above-mentioned term in the present invention can be understood according to the specific situations.

The terms used herein are only for describing specific embodiments and are not intended to limit the exemplary embodiments. Unless the context clearly dictates otherwise, the singular forms such as "a" and "one" used herein are also intended to include the plural. It should also be understood that the terms "including" and/or "comprising" used herein specify the existence of the stated features, integers, steps, operations, units and/or components, and do not exclude the existence or addition of one or more other features, integers, steps, operations, units, components, and/or combinations thereof.

Please refer to FIG. 1, which is a schematic cross-sectional view of a first embodiment of the cholesteric liquid crystal composite display device 10 of the present invention. To achieve at least one of the aforementioned advantages or other advantages, the first embodiment of the present invention provides a cholesteric liquid crystal composite display device 10. As shown in FIG. 1, the cholesteric liquid crystal composite display device 10 includes a light absorbing substrate 110, a first transparent substrate 120, a second transparent substrate 130, a first electrode layer 210, a second electrode layer 220, a first cholesteric liquid crystal layer 310, a first light absorbing layer 410 and a light supplement module 500. The first transparent substrate 120 and the second transparent substrate 130 may be rigid substrates, such as glass substrates or polymethyl methacrylate (PMMA) substrates. Alternatively, it may be a flexible substrate, for example, a substrate made of polyimide or polyethylene terephthalate as the main component. In addition to the materials exemplified above, the first transparent substrate 120 and the second transparent substrate 130 can also be rigid substrates or flexible substrates made of other materials.

The material of the light absorbing substrate 110 may be the same as the above-mentioned first transparent substrate 120, but is not limited thereto. In a preferred embodiment, the light absorbing substrate 110 is opaque, for example, a black opaque PMMA substrate, a PI substrate or a PET substrate, so that the light absorbing substrate 110 can absorb visible light and appear black. Alternatively, the surface of the light absorbing substrate 110 is black, that is, the surface of the light absorbing substrate 110 is coated with black ink, black absorbing material, or covered with a black adhesive film, so that the light absorbing substrate 110 can absorb visible light and appear black, thereby the first cholesteric liquid crystal layer 310 can function.

Please continue to refer to FIG. 1, the first electrode layer 210 is formed on the first transparent substrate 120, the second electrode layer 220 is formed on the second transparent substrate 130, and the first electrode layer 210 and the second electrode layer 220 are configured facing each other. In other words, the first electrode layer 210 is located on the side of the first transparent substrate 120 close to the first cholesteric liquid crystal layer 310, and the second electrode layer 220 is located on the side of the second transparent substrate 130 close to the first cholesteric liquid crystal layer 310. The first electrode layer 210 and the second electrode layer 220 are made of the same material, and both can be transparent conductive materials. It should be noted that, the first electrode layer 210 and the second electrode layer 220 are not limited to be in contact with the transparent substrate.

Please continue to refer to FIG. 1, the first cholesteric liquid crystal layer 310 is sandwiched between the first electrode layer 210 and the second electrode layer 220. When a voltage is generated between the first electrode layer 210 and the second electrode layer 220 due to electrification, an electric field is generated between the first electrode layer 210 and the second electrode layer 220, thereby changing the alignment state of the liquid crystal molecules in the first cholesteric liquid crystal layer 310, so that the first cholesteric liquid crystal layer 310 may be in a focal conic arrangement state or a planar arrangement state. When external light is incident on the cholesteric liquid crystal composite display device 10 from the second transparent substrate 130, the first cholesteric liquid crystal layer 310 in a planar arrangement state can reflect the first color light in the external light, in other words, the first cholesteric liquid crystal layer 310 can generate a first color light, and the first color light has a first wavelength range; other color lights are absorbed by the light absorbing substrate 110. It should be noted that although the first color light has the first wavelength range, it also includes other wavelength ranges other than the first wavelength range, so the first wavelength range is not equal to the entire wavelength range of the first color light.

Please continue to refer to FIG. 1, the first light absorbing layer 410 is disposed on one side of the second transparent substrate 130 for absorbing light outside the first wavelength range, when the external light and the first color light enter the first light absorbing layer 410, the first light absorbing layer 410 can allow the first color light within the first wavelength range to pass, and reduce the first color light except the first wavelength range to be emitted upwardly from the second transparent substrate 130. In this way, the first light absorbing layer 410 helps to improve the color saturation of the pixel display and improve the image quality of the cholesteric liquid crystal composite display device 10.

Please continue to refer to FIG. 1, the light supplement module 500 is disposed between the light absorbing substrate 110 and the first transparent substrate 120, and the light emitting normal direction Z is perpendicular to the upper surface of the light absorbing substrate 110. Most of the existing cholesteric liquid crystal displays must use an external ambient light source for the cholesteric liquid crystal to reflect light to display images and colors. When the brightness is low in an external environment, the image display quality will be reduced a lot. The light supplement module 500 of the present invention is used to emit supplementary light in an external environment with low brightness, which is emitted outward after passing through the first cholesteric liquid crystal layer 310 and other related components, thereby improves the display brightness of the composite display device 10 and maintain the display and color of the composite display device 10.

Please continue to refer to FIG. 1, the composite display device 10 further includes a brightness sensing module 600 and a control module 700. The brightness sensing module 600 is electrically connected to the control module 700 for sensing the brightness of the external environment and transmitting such brightness information to the control module 700. In one embodiment, the brightness sensing module 600 generates a brightness signal according to the brightness of the external environment, and sends the brightness signal to the control module 700. The brightness sensing module 600 can be disposed in the composite display device 10 or externally connected to the composite display device 10.

The control module 700 is electrically connected to the light supplement module 500 for controlling the working state of the light supplement module 500. In one embodiment, the control module 700 can select to turn on or turn off the light supplement module 500 according to the brightness value of the external environment detected by the brightness sensing module 600. For example, if the brightness value in the brightness signal received by the control module 700 is lower than the preset brightness value, the control module 700 controls the light supplement module 500 to emit supplementary light, and the first electrode layer 210 and the second electrode layer 220 drive the first cholesteric liquid crystal molecule layer to be in a state of focal conic arrangement, so that the supplementary light can penetrate the first cholesteric liquid crystal molecule layer, and the emitted supplementary light can enhance the display brightness of the composite display device 10 to meet the needs of users.

In one embodiment, as shown in FIG. 1, the light supplement module 500 can use an OLED panel, which can generate a surface light source and have a thin thickness, light weight, and good shock resistance. In one embodiment, the light supplement module 500 may use a Micro OLED (Micro OLED) panel. Compared with LEDs, which are driven by low-temperature polysilicon materials, Micro OLEDs are driven by monocrystalline silicon substrates, therefore the pixel size of Micro OLED is much smaller than that of OLED, it can be made into extremely high PPI, the resolution can be made extremely large, and the response speed is very fast, which can effectively relieve the visual fatigue of human eyes.

Figure 2:
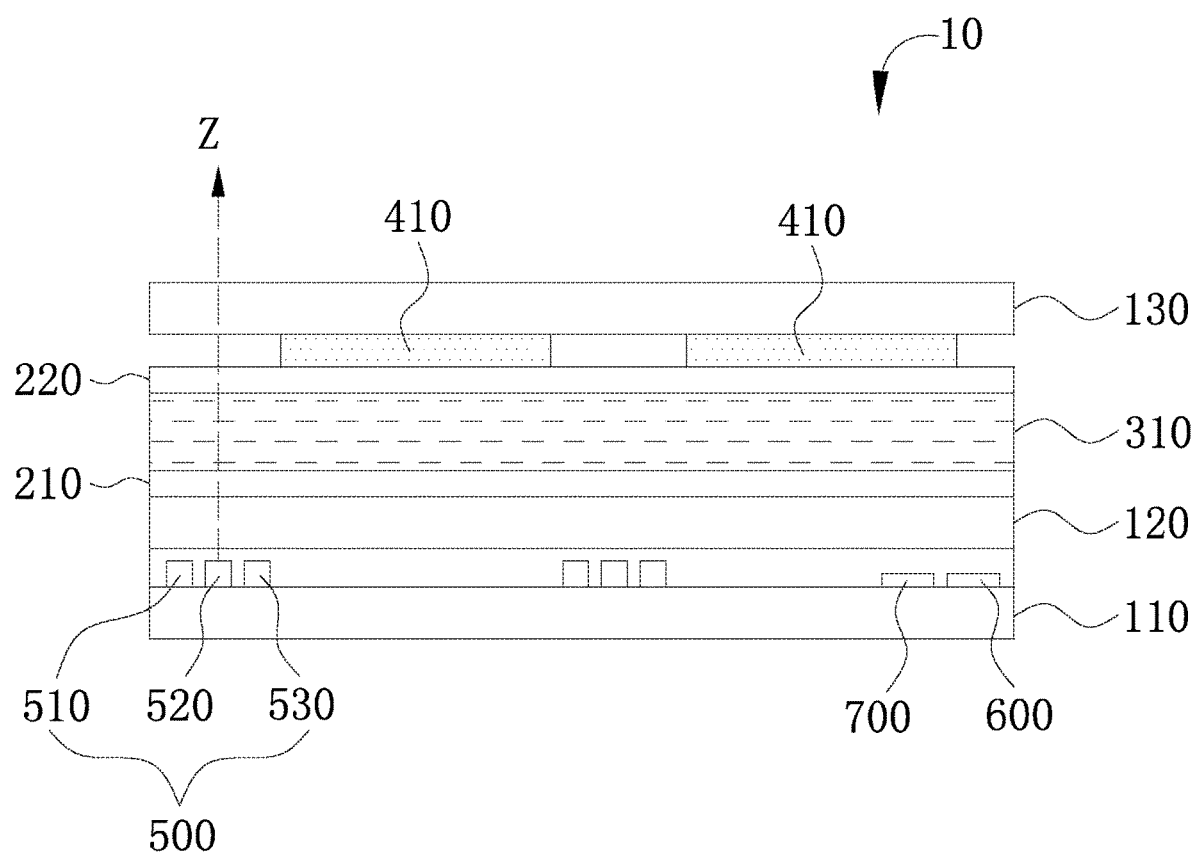

In another embodiment, the light supplement module 500 includes a light emitting chip array, such as a semiconductor-type light emitting chip array, e.g., a Micro LED or a Mini LED. The Micro LED refers to a thin film, miniaturized, high-density integrated LED array. The distance between the LED pixels in the array is on the order of 10 microns, and each LED pixel can emit light by itself. Mini LED refers to an LED array with a chip size on the order of 100 microns, and the chip size is between small-pitch LEDs and micro-LEDs, which is the result of further refinement of small-pitch LEDs. Among them, small-pitch LED refers to that the spacing between adjacent LED chips is less than 2.5 mm. As shown in FIG. 2, the light emitting chip array includes a plurality of first light emitting chips 510, a plurality of second light emitting chips 520 and a plurality of third light emitting chips 530. The first light emitting chip 510, the second light emitting chip 520 and the third light emitting chip 530 are regularly disposed on the light absorbing substrate 110. In one embodiment, the projection of the first light absorbing layer 410 on the horizontal plane and the projection of the light supplement module 500 on the horizontal plane are arranged in a misaligned manner, and the area corresponding to the light emitting normal direction Z displayed by the light supplement module 500 is not covered by the first light absorbing layer 410 so as to prevent the supplementary light emitted by the light supplement module 500 from being absorbed by the first light absorbing layer 410. Moreover, the light emitting color of the first light emitting chip 510, the second light emitting chip 520 and the third light emitting chip 530 is one of red, blue or green, respectively. In one embodiment, the light emitting colors of the first light emitting chip 510, the second light emitting chip 520 and the third light emitting chip 530 are different, so that the supplementary light emitted by the light supplement module 500 can be colored. For example, the first light emitting chip 510 emits red light, the second light emitting chip 520 emits blue light, and the third light emitting chip 530 emits green light.

Figure 3:
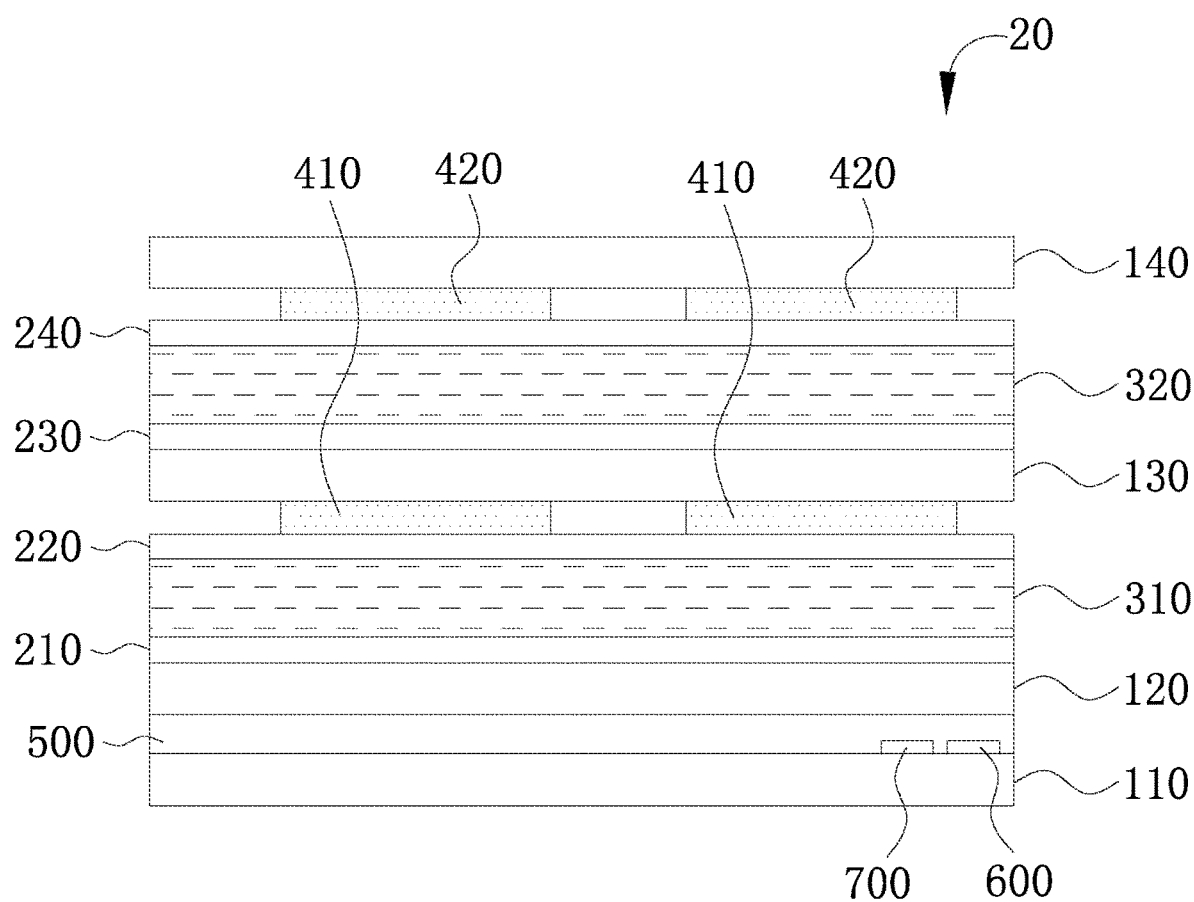
FIG. 3 and FIG. 4 are schematic cross-sectional views of the second embodiment of the cholesteric liquid crystal composite display device of the present invention.
Figure 4:
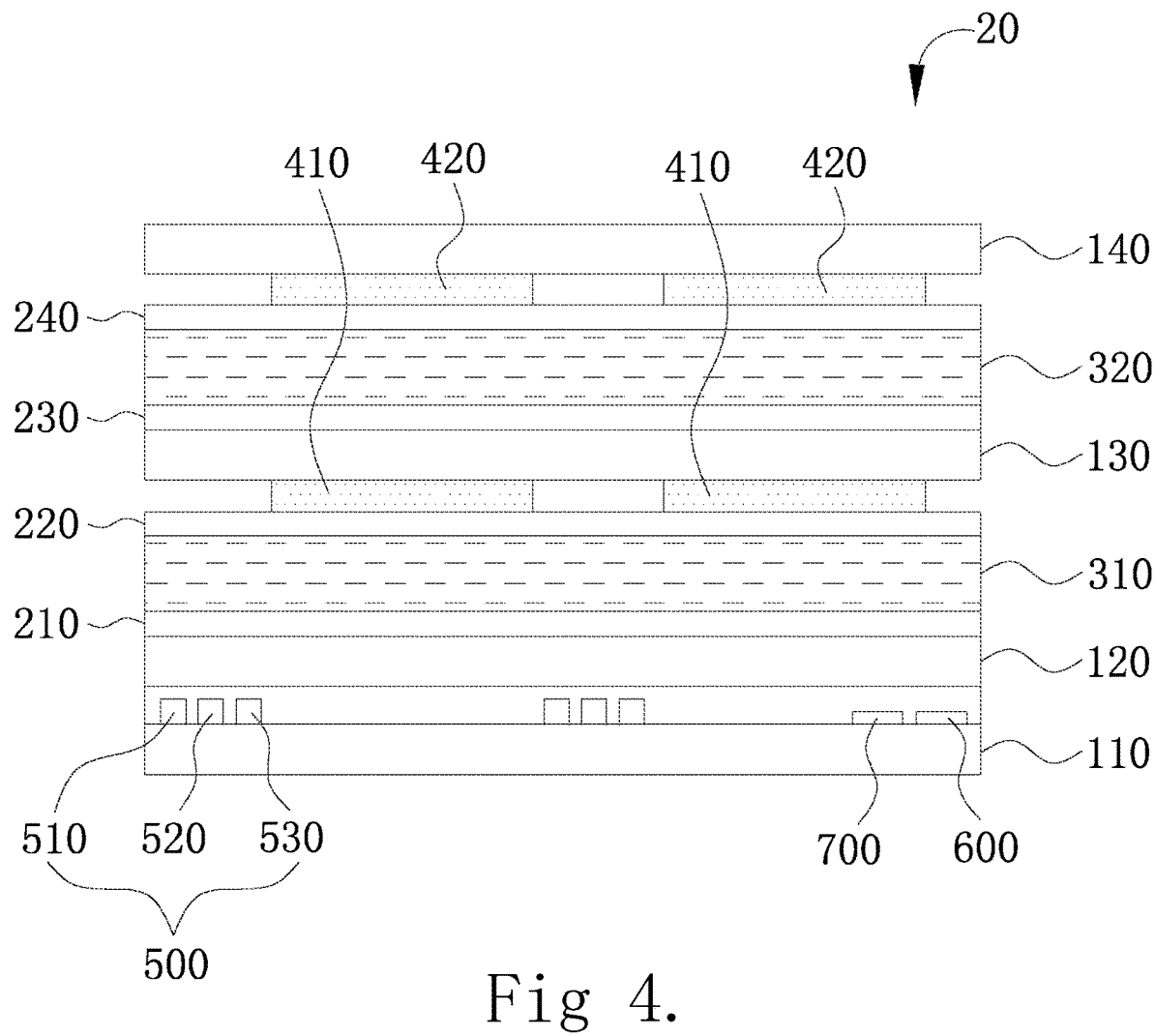

Please refer to FIG. 3 and FIG. 4, which are schematic cross-sectional views of the second embodiment of the cholesteric liquid crystal composite display device 20 of the present invention. To achieve at least one of the aforementioned advantages or other advantages, a second embodiment of the present invention provides a cholesteric liquid crystal composite display device 20. The cholesteric liquid crystal composite display device 20 of this embodiment includes the cholesteric liquid crystal composite display device 10 of the first embodiment, and further includes a third transparent substrate 140, a third electrode layer 230, a fourth electrode layer 240, a second cholesteric liquid crystal layer 320 and a second light absorbing layer 420.

The third electrode layer 230 is formed on the second transparent substrate 130, the fourth electrode layer 240 is formed on the third transparent substrate 140, and the fourth electrode layer 240 and the third electrode layer 230 are disposed facing each other. In other words, the third electrode layer 230 is located on the side of the second transparent substrate 130 close to the second cholesteric liquid crystal layer 320, and the fourth electrode layer 240 is located on the side of the third transparent substrate 140 close to the second cholesteric liquid crystal layer 320. The third electrode layer 230 and the fourth electrode layer 240 are made of the same material, and both can be transparent conductive materials. It should be noted that, the third electrode layer 230 and the fourth electrode layer 240 are not limited to be in contact with the transparent substrate.

The second cholesteric liquid crystal layer 320 is sandwiched between the third electrode layer 230 and the fourth electrode layer 240. When the third electrode layer 230 and the fourth electrode layer 240 generate a voltage due to electrification, an electric field is generated between the third electrode layer 230 and the fourth electrode layer 240, the liquid crystal molecules in the second cholesteric liquid crystal layer 320 are changed accordingly, so that the second cholesteric liquid crystal layer 320 can be in a focal conic alignment state or a planar alignment state. When the external light is incident on the cholesteric liquid crystal composite display device 20 from the third transparent substrate 140, the second cholesteric liquid crystal layer 320 in the planar arrangement state can reflect the second color light in the external light, in other words, the second cholesteric liquid crystal layer 320 can generate the second color light, which has a second wavelength range. It should be noted that although the second color light has a second wavelength range, it also includes other wavelength ranges other than the second wavelength range, so the second wavelength range is not equal to the entire wavelength range of the second color light. In addition, the second wavelength range of the second color light is different from the first wavelength range of the first color light, so the color of the second color light may not be used for the color of the first color light, for example, the first color light is red light, the second color light can be blue light.

The second light absorbing layer 420 is disposed on one side of the third transparent substrate 140, and corresponds to the top of the first light absorbing layer 410, and is used to absorb light except the first wavelength range and the second wavelength range, so that the first color light within the first wavelength range and the second color light within the second wavelength range can pass through the second light absorbing layer 420 and the third transparent substrate 140. In this way, the second light absorbing layer 420 can reduce the emission of the second color light except the second wavelength range from the third transparent substrate 140, thereby further improving the image quality of the cholesteric liquid crystal composite display device 20.

Figure 5:
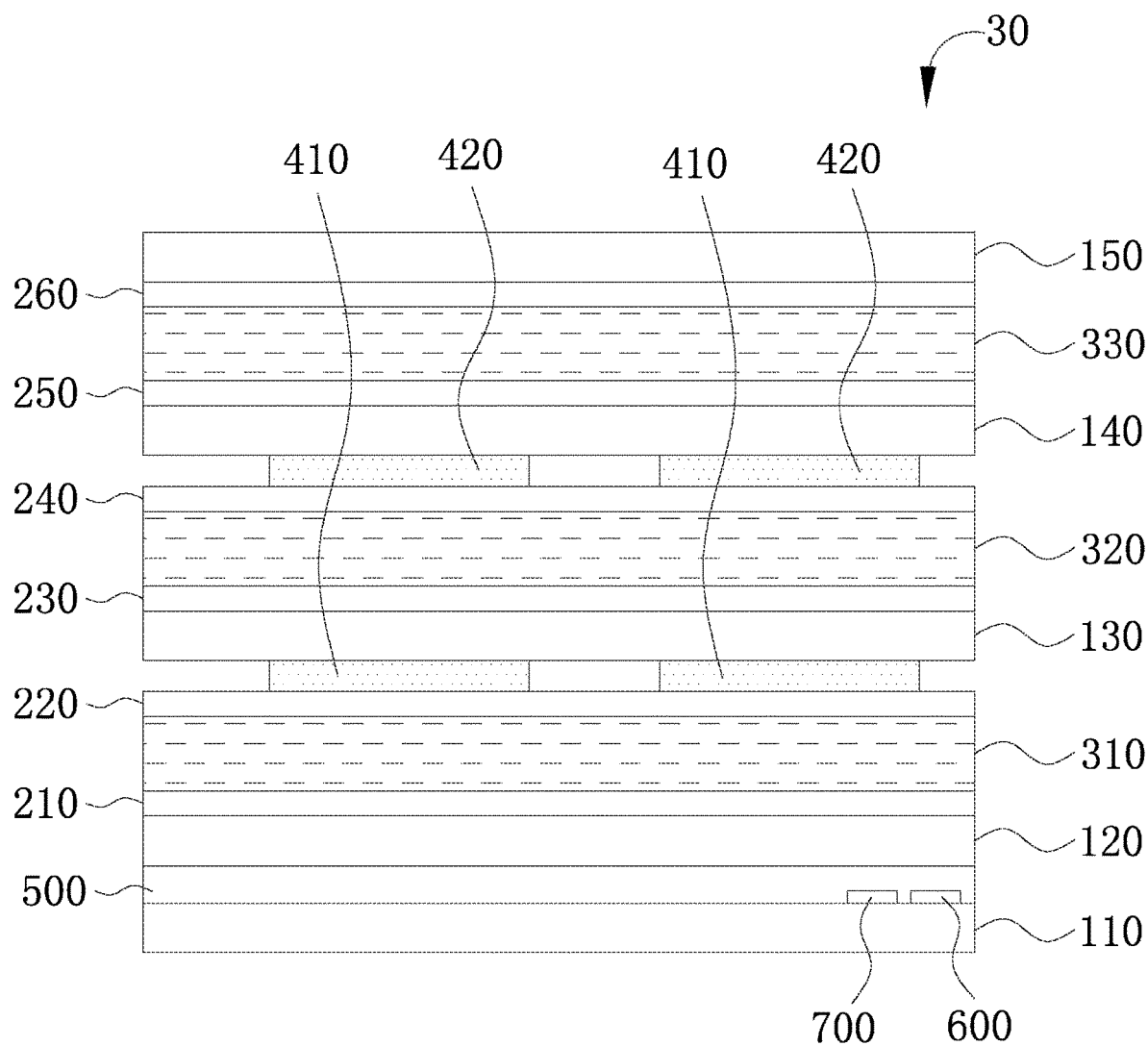
FIG. 5 and FIG. 6 are schematic cross-sectional views of a third embodiment of the cholesteric liquid crystal composite display device of the present invention.
Figure 6:
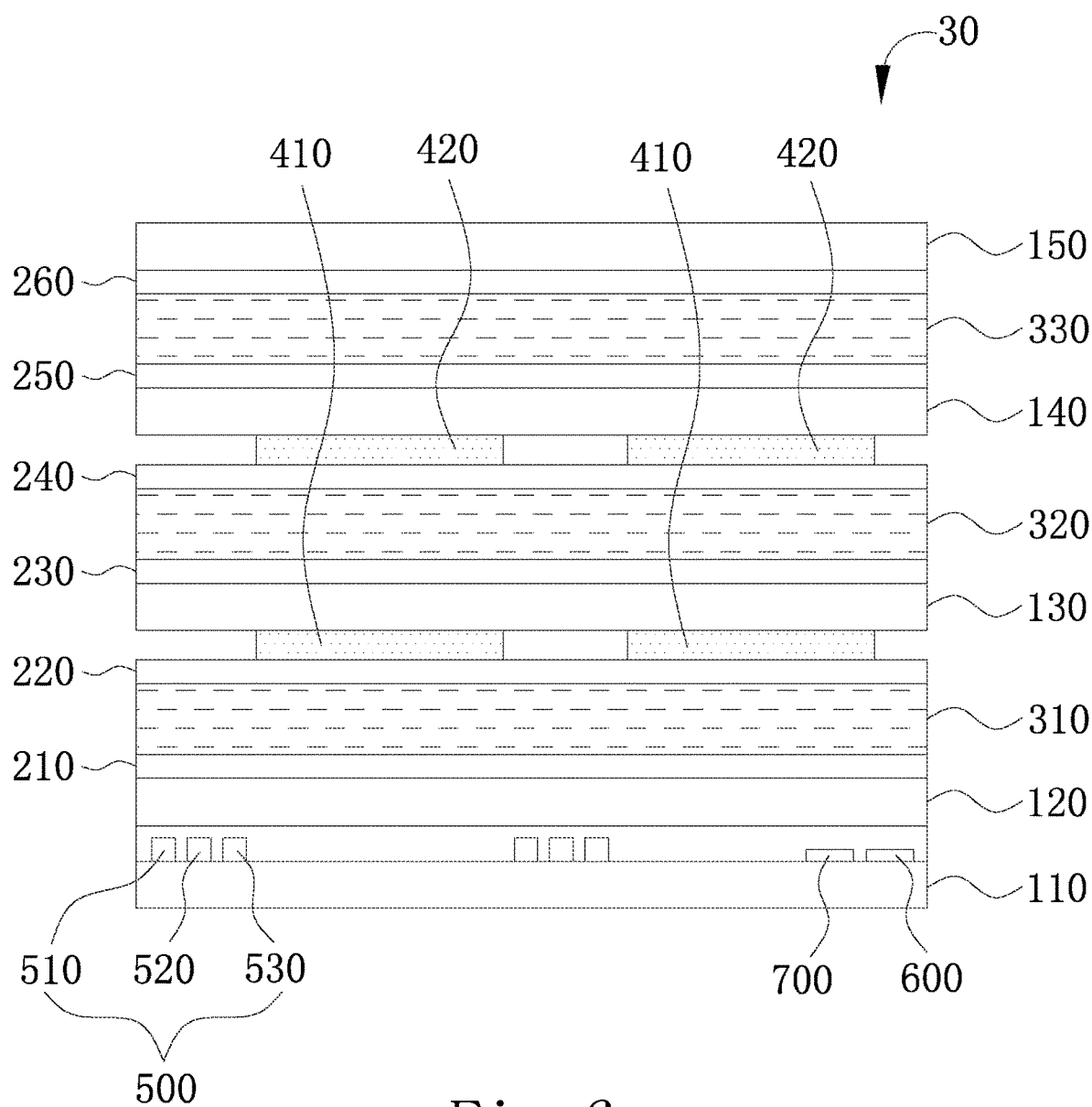

Please refer to FIG. 5 and FIG. 6, which are schematic cross-sectional views of the third embodiment of the present invention. To achieve at least one of the aforementioned advantages or other advantages, a third embodiment of the present invention provides a cholesteric liquid crystal composite display device 30, including the cholesteric liquid crystal composite display device 20 of the second embodiment, and further comprising a fourth transparent substrate 150, the fifth electrode layer 250, the sixth electrode layer 260 and the third cholesteric liquid crystal layer 330.

The fifth electrode layer 250 is formed on the third transparent substrate 140, the sixth electrode layer 260 is formed on the fourth transparent substrate 150, and the sixth electrode layer 260 and the fifth electrode layer 250 are disposed facing each other. In other words, the fifth electrode layer 250 is located on the side of the third transparent substrate 140 close to the third cholesteric liquid crystal layer 330, and the sixth electrode layer 260 is located on the side of the fourth transparent substrate 150 close to the third cholesteric liquid crystal layer 330. The fifth electrode layer 250 and the sixth electrode layer 260 are made of the same material, and both can be transparent conductive materials. It should be noted that the fifth electrode layer 250 and the sixth electrode layer 260 are not limited to be in contact with the transparent substrate.

The third cholesteric liquid crystal layer 330 is sandwiched between the fifth electrode layer 250 and the sixth electrode layer 260. When the fifth electrode layer 250 and the sixth electrode layer 260 generate a voltage due to electrification, an electric field is generated between the fifth electrode layer 250 and the sixth electrode layer 260, the liquid crystal molecules in the third cholesteric liquid crystal layer 330 are changed accordingly, so that the third cholesteric liquid crystal layer 330 can be in a focal conic alignment state or a planar alignment state. When the external light is incident on the cholesteric liquid crystal composite display device 30 from the fourth transparent substrate 150, the third cholesteric liquid crystal layer 330 in the planar arrangement state can reflect the third color light in the external light, in other words, the third cholesteric liquid crystal layer 330 can generate the third color light. In addition, the color of the third color light may not be used for the color of the first color light and the color of the second color light. In one embodiment, the colors of the first color light, the second color light and the third color light are respectively selected from one of the groups consisting of red, blue and green, and the colors of the first color light, the second color light and the third color lights are different, so that the cholesteric liquid crystal composite display device 30 has the ability to display color images. For example, the first color light may be red light, the second color light may be blue light, and the third color light may be green light. The first wavelength range corresponding to red color light is 590 nm to 740 nm, the second wavelength range corresponding to green color light is 500 nm to 590 nm, and the third wavelength range corresponding to blue color light is 415 nm to 500 nm.

In one embodiment, the surfaces of the first transparent substrate 120, the second transparent substrate 130, the third transparent substrate 140 and the fourth transparent substrate 150 are coated with a transparent polyimide PI film or a PET film, which can further improve the color rendering performance of the cholesteric liquid crystal composite display device 10.

In addition, the positions of the first light absorbing layer 410 and the second light absorbing layer 420 can be adjusted according to actual needs. For example: the first light absorbing layer 410 is located on a side of the second transparent substrate 130 close to the first cholesteric liquid crystal layer 310, and the second light absorbing layer 420 is located on a side of the third transparent substrate 140 close to the second cholesteric liquid crystal layer 320; or the first light absorbing layer 410 is located on a side of the second transparent substrate 130 away from the first cholesteric liquid crystal layer 310, and the second light absorbing layer 420 is located at a side of the third transparent substrate 140 away from the second cholesteric liquid crystal layer 320; or the first light absorbing layer 410 is located on a side of the second transparent substrate 130 close to the first cholesteric liquid crystal layer 310, and the second light absorbing layer 420 is located on a side of the third transparent substrate 140 away from the second cholesteric liquid crystal layer 320; or the first light absorbing layer 410 is located on a side of the second transparent substrate 130 away from the first cholesteric liquid crystal layer 310, and the second light absorbing layer 420 is located on a side of the third transparent substrate 140 close to the second cholesteric liquid crystal layer 320.

To sum up, using the cholesteric liquid crystal composite display device provided by the present invention, when the brightness of the external environment is low, the control module 700 will control the light supplement module 500 to emit supplementary light, and the light supplement module 500 can use the OLED panel or the light emitting chip array, thereby the display brightness of the cholesteric liquid crystal composite display device can be enhanced. By disposing the first light absorbing layer 410 or combining the first light absorbing layer 410 and the second light absorbing layer 420, the color saturation of the cholesteric liquid crystal composite display device 10 can be enhanced.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A cholesteric liquid crystal composite display device, comprising:
    a light absorbing substrate;
    a first transparent substrate;
    a second transparent substrate;
    a light supplement module, disposed between the light absorbing substrate and the first transparent substrate, the light supplement module including a light emitting chip array, and the light emitting chip array including a plurality of first light emitting chips, a plurality of second light emitting chips, and a plurality of third light emitting chips, and the first light emitting chip, the second light emitting chip and the third light emitting chip are micro-LED chips or mini-LED chips;
    a brightness sensing module, for sensing the brightness of the external environment of the cholesteric liquid crystal composite display device to generate a brightness signal;
    a control module, electrically connected to the light supplement module and the brightness sensing module, and receiving the brightness signal, so as to enable or disable the light supplement module according to the brightness signal;
    a first electrode layer, formed on the first transparent substrate;
    a second electrode layer, formed on the second transparent substrate, and facing the first electrode layer;
    a first cholesteric liquid crystal layer, sandwiched between the first electrode layer and the second electrode layer for generating a first color light, the first color light having a first wavelength range; and
    a first light absorbing layer, disposed on one side of the second transparent substrate, for absorbing light except the first wavelength range, wherein a projection of the first light absorbing layer on the horizontal plane and a projection of the light supplement module on the horizontal plane are arranged in a misaligned manner.

2. A cholesteric liquid crystal composite display device according to claim 1, further comprising: a third transparent substrate, a third electrode layer, a fourth electrode layer, a second cholesteric liquid crystal layer and a second light absorbing layer, the third electrode layer formed on the second transparent substrate, the fourth electrode layer formed on the third transparent substrate, the fourth electrode layer and the third electrode layer arranged facing each other, the second cholesteric liquid crystal layer sandwiched between the third electrode layer and the fourth electrode layer for generating a second color light, the second color light having a second wavelength range, and the second wavelength range being different from the first wavelength range, the second light absorbing layer disposed on one side of the third transparent substrate, and corresponding to the top of the first light absorbing layer, for absorbing light except the first wavelength range and the second wavelength range.

3. The cholesteric liquid crystal composite display device according to claim 2, wherein the first light absorbing layer is located on a side of the second transparent substrate close to the first cholesteric liquid crystal layer, the second light absorbing layer is located on a side of the third transparent substrate close to the second cholesteric liquid crystal layer, the colors of the first color light, the second color light and the third color light are respectively selected from one of the groups consisting of red, blue and green, and the colors of the first color light, the second color light and the third color light are different.

4. The cholesteric liquid crystal composite display device according to claim 2, wherein the first light absorbing layer is located on a side of the second transparent substrate away from the first cholesteric liquid crystal layer, the second light absorbing layer is located on a side of the third transparent substrate away from the second cholesteric liquid crystal layer, the colors of the first color light, the second color light and the third color light are respectively selected from one of the groups consisting of red, blue and green, the colors of the first color light, the second color light and the third color light are different.

5. The cholesteric liquid crystal composite display device according to claim 2, wherein the first light absorbing layer is located on a side of the second transparent substrate close to the first cholesteric liquid crystal layer, the second light absorbing layer is located on a side of the third transparent substrate close to the second cholesteric liquid crystal layer, the colors of the first color light, the second color light and the third color light are respectively selected from one of the groups consisting of red, blue and green, and the colors of the first color light, the second color light and the third color light are different.

6. The cholesteric liquid crystal composite display device according to claim 2, wherein the first light absorbing layer is located on a side of the second transparent substrate away from the first cholesteric liquid crystal layer, the second light absorbing layer is located on a side of the third transparent substrate away from the second cholesteric liquid crystal layer, the colors of the first color light, the second color light and the third color light are respectively selected from one of the groups consisting of red, blue and green, and the colors of the first color light, the second color light and the third color light are different.

7. A cholesteric liquid crystal composite display device according to claim 2, further comprising: a fourth transparent substrate, a fifth electrode layer, a sixth electrode layer and a third cholesteric liquid crystal layer, the fifth electrode layer formed on the third transparent substrate, the sixth electrode layer formed on the fourth transparent substrate, the sixth electrode layer and the fifth electrode layer arranged facing each other, the third cholesteric liquid crystal layer sandwiched between the fifth electrode layer and the sixth electrode layer for generating a third color light, the third color light having a third wavelength range.

8. The cholesteric liquid crystal composite display device according to claim 7, wherein the first light absorbing layer is located on a side of the second transparent substrate close to the first cholesteric liquid crystal layer, the second light absorbing layer is located on a side of the third transparent substrate close to the second cholesteric liquid crystal layer, the colors of the first color light, the second color light and the third color light are respectively selected from one of the groups consisting of red, blue and green, and the colors of the first color light, the second color light and the third color light are different.

9. The cholesteric liquid crystal composite display device according to claim 7, wherein the first light absorbing layer is located on a side of the second transparent substrate away from the first cholesteric liquid crystal layer, the second light absorbing layer is located on a side of the third transparent substrate away from the second cholesteric liquid crystal layer, the colors of the first color light, the second color light and the third color light are respectively selected from one of the groups consisting of red, blue and green, the colors of the first color light, the second color light and the third color light are different.

10. The cholesteric liquid crystal composite display device according to claim 7, wherein the first light absorbing layer is located on a side of the second transparent substrate close to the first cholesteric liquid crystal layer, the second light absorbing layer is located on a side of the third transparent substrate close to the second cholesteric liquid crystal layer, the colors of the first color light, the second color light and the third color light are respectively selected from one of the groups consisting of red, blue and green, and the colors of the first color light, the second color light and the third color light are different.

11. A cholesteric liquid crystal composite display device, comprising:
a light absorbing substrate;
a first transparent substrate;
a second transparent substrate;
a light supplement module, disposed between the light absorbing substrate and the first transparent substrate, the light supplement module including an OLED panel or a micro-OLED panel;
a brightness sensing module, for sensing the brightness of the external environment of the cholesteric liquid crystal composite display device to generate a brightness signal;
a control module, electrically connected to the light supplement module and the brightness sensing module, and receiving the brightness signal, so as to enable or disable the light supplement module according to the brightness signal;
a first electrode layer, formed on the first transparent substrate;
a second electrode layer, formed on the second transparent substrate, and facing the first electrode layer;
a first cholesteric liquid crystal layer, sandwiched between the first electrode layer and the second electrode layer for generating a first color light, the first color light having a first wavelength range; and
a first light absorbing layer, disposed on one side of the second transparent substrate for absorbing light except the first wavelength range, wherein the light emitting normal direction of the light supplement module is perpendicular to the surface of the light absorbing substrate.

12. A cholesteric liquid crystal composite display device according to claim 11, further comprising: a third transparent substrate, a third electrode layer, a fourth electrode layer, a second cholesteric liquid crystal layer and a second light absorbing layer, the third electrode layer formed on the second transparent substrate, the fourth electrode layer formed on the third transparent substrate, the fourth electrode layer and the third electrode layer arranged facing each other, the second cholesteric liquid crystal layer sandwiched between the third electrode layer and the fourth electrode layer for generating a second color light, the second color light having a second wavelength range, the second wavelength range being different from the first wavelength range, the second light absorbing layer disposed on one side of the third transparent substrate, and corresponding to the top of the first light absorbing layer, for absorbing light except the first wavelength range and the second wavelength range.

13. A cholesteric liquid crystal composite display device according to claim 12, further comprising: a fourth transparent substrate, a fifth electrode layer, a sixth electrode layer and a third cholesteric liquid crystal layer, the fifth electrode layer formed on the third transparent substrate, the sixth electrode layer formed on the fourth transparent substrate, the sixth electrode layer and the fifth electrode layer arranged facing each other, the third cholesteric liquid crystal layer sandwiched between the fifth electrode layer and the sixth electrode layer for generating a third color light, the third color light having a third wavelength range, the third wavelength range being different from the first wavelength range and the second wavelength range.

* * * * *